United States Patent [19]
Jeon

[11] Patent Number: 5,835,399
[45] Date of Patent: Nov. 10, 1998

[54] IMPRINT COMPENSATION CIRCUIT FOR USE IN FERROELECTRIC SEMICONDUCTOR MEMORY DEVICE

[75] Inventor: Byung-Gil Jeon, Suwon, Rep. of Korea

[73] Assignee: Samsung Electronics, Co., Ltd., Suwon, Rep. of Korea

[21] Appl. No.: 857,469

[22] Filed: May 15, 1997

[30] Foreign Application Priority Data

May 16, 1996 [KR] Rep. of Korea ...................... 96/16884

[51] Int. Cl.⁶ .................................................. G11C 11/22
[52] U.S. Cl. .......................................... 365/145; 365/149
[58] Field of Search .............................. 365/145, 189.01, 365/189.09, 149, 233

[56] References Cited

U.S. PATENT DOCUMENTS 5,592,410  1/1997  Verhaeghe et al. ..................... 365/145
5,600,587  2/1997  Koike ..................................... 365/145

*Primary Examiner*—Son Mai
*Attorney, Agent, or Firm*—Marger, Johnson, McCollom, & Stolowitz P.C.

[57] ABSTRACT

A semiconductor memory device having a unit memory cell consisting of, a ferroelectric capacitor having a first and second electrodes, and an access transistor connected to the first electrode of the capacitor and to the bit line, is disclosed. An imprint compensation circuit for applying a predetermined voltage to the first electrode through the write path of the memory device, or for applying a signal in the form of pulse to the second electrode, where data access of the memory device is prohibited, in order to imprint the ferroelectric capacitor in first and second directions from the reference point, creating a normal polarization characteristic.

9 Claims, 5 Drawing Sheets

IMPRINT COMPENSATION CIRCUIT FOR USE IN FERROELECTRIC SEMICONDUCTOR MEMORY DEVICE

BACKGROUND OF THE INVENTION

1. Field of the Invention

The present invention relates to memory devices, more particularly, to an imprint compensation circuit for use in a ferroelectric semiconductor memory device.

2. Description of the Related Art

Conventional ferroelectric semiconductor memory devices comprise a plurality of cells having nonvolatile characteristics. Each cell typically includes a ferroelectric capacitor, in which a ferroelectric material is interposed between two metal electrodes (i.e. storage and plate metal electrodes), and a pass or access transistor whose source is connected to the storage metal electrode. It is well known in the art that ferroelectric materials, such as lead zirconate titanate (PZT), lead-lanthanum-zirconium-titanate (PLZT), barium titanate, and others are often used in a capacitor as dielectric materials. For example, a transistor employing a capacitor cell made of PZT was disclosed in U.S. Pat. No. 5,189,594 issued to Kazuhiro Hoshiba.

It is well known that ferroelectric material has a hysteresis loop characteristic and data can be stored by utilizing the same. FIG. 1 shows a typical hysteresis loop characteristic for a ferroelectric material, where the x-axis represents intensity of electric field or voltage and the y-axis represents polarization or charge. In FIG. 1, Vc, referred to as the coercive voltage, denotes a sufficient voltage for a polarization direction of the material to be inverted. Initially, when a positive saturation voltage greater than the coercive voltage Vc is applied between two electrodes of a ferroelectric capacitor, the polarization (charge) increases toward point "a" along the curve as shown in FIG. 1. Thereafter, switching the applied voltage to off causes charge decrease a nominal value from "a" to "A" along the hysteresis loop. The ferroelectric capacitor retains the polarization value Pr to represent a binary "1". To write and store a binary "0", a negative saturation voltage, corresponding to point "b", is applied to the electrodes to move the polarization from "A" to "b". Similarly, when the applied voltage is shut off the polarization is kept relatively stable at "B" along the hysteresis loop, and holds a value of–Pr. The stored data is detected by a sensing circuit in a ferroelectric semiconductor memory.

As can be seen in FIG. 1, a typical hysteresis loop is generally symmetrical or centered with respect to the origin 0. However, the hysteresis loop can lose the symmetry by shifting due to various manufacturing conditions, such as temperature, pressure, and mechanical stress of manufacturing process of the ferroelectric semiconductor memory device. Such a loop shift is referred to as an imprint. Right and left imprints of the hysteresis loop are respectively illustrated in FIGS. 2A and 2B. As can be seen in each of these figures, the difference in charges between points A and B significantly decreases as compared to that of a symmetrical hysteresis loop in FIG. 1. The imprints cause sensing margin to reduce considerably, and can hurt the reliably of data detection in a ferroelectric capacitor. Since the coercive voltage +Vc has been moved to the right in FIG. 2A, the change of polarization or charge from points B to A requires the higher applied voltage. Therefore, when the applied voltage is lower than the coercive voltage +Vc, reversal data from data "0" to "1" cannot be written into the capacitor. Similarly, reversal data from data "1" to "0" cannot be written thereinto. Moreover, the change of charges from A to B can be occurred by a small voltage level of noise.

SUMMARY OF THE INVENTION

An object of the present invention is to provide a circuit for compensating imprint degradations of a ferroelectric capacitor in a semiconductor memory device.

In a memory device having a memory cell, a ferroelectric capacitor includes first and second electrodes and an access transistor connected to the first electrode and to a bit line. The device further includes an imprint compensation circuit for applying a predetermined voltage to the first electrode through a write path of the memory device, or for applying a signal in the form of pulse to the second electrode, when data access of the memory device is prohibited, in order to make the ferroelectric capacitor imprinted in one of a first and second direction from the reference point have a normal polarization characteristic.

The above and other features of the invention including various novel details of construction and combinations of parts will now be more particularly described with reference to the accompanying drawings and pointed out in the appended claims.

DETAILED DESCRIPTION OF THE PREFERRED EMBODIMENT

Figure 1:
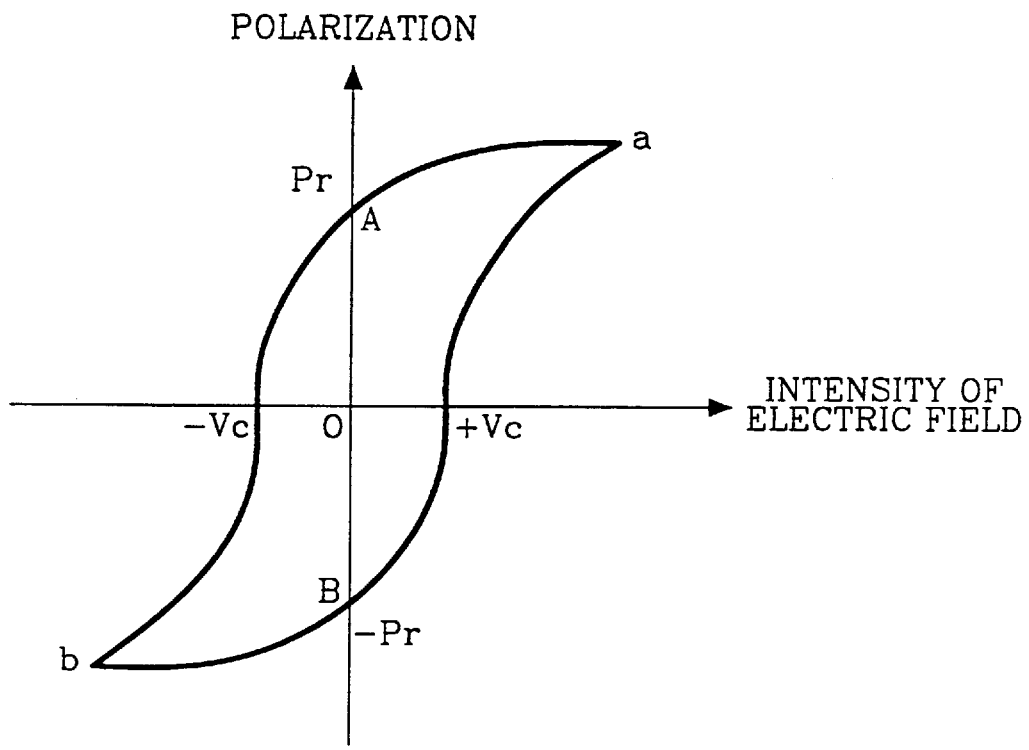
FIG. 1 shows a hysteresis loop of a typical ferroelectric capacitor.
Figure 2A:
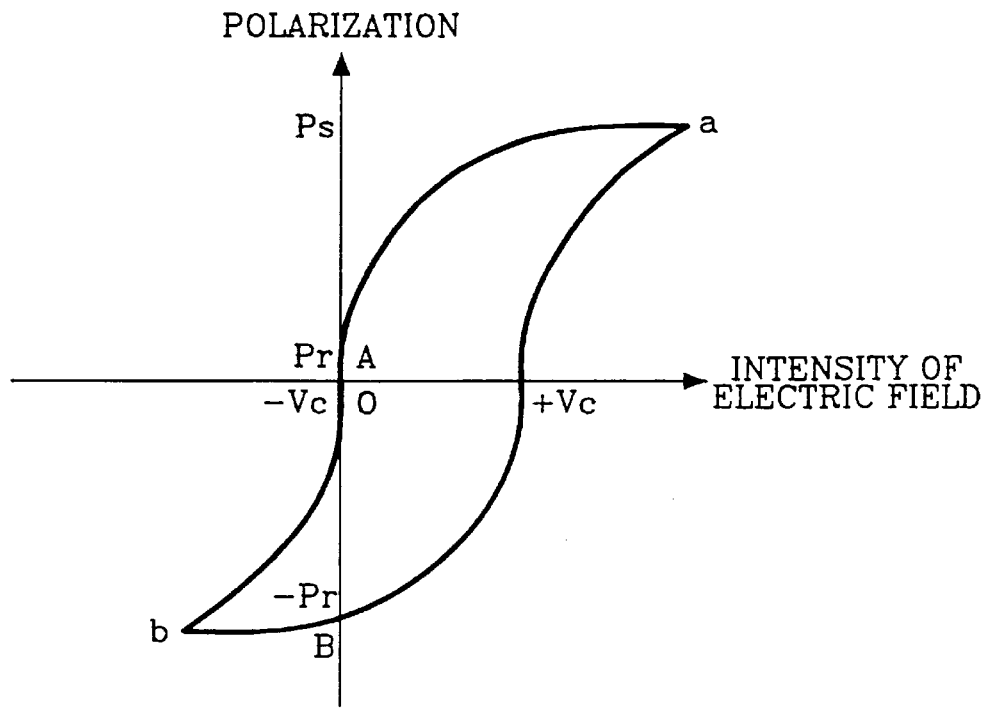
FIGS. 2A and 2B show right and left imprints of a ferroelectric material in a ferroelectric capacitor, respectively.
Figure 2B:
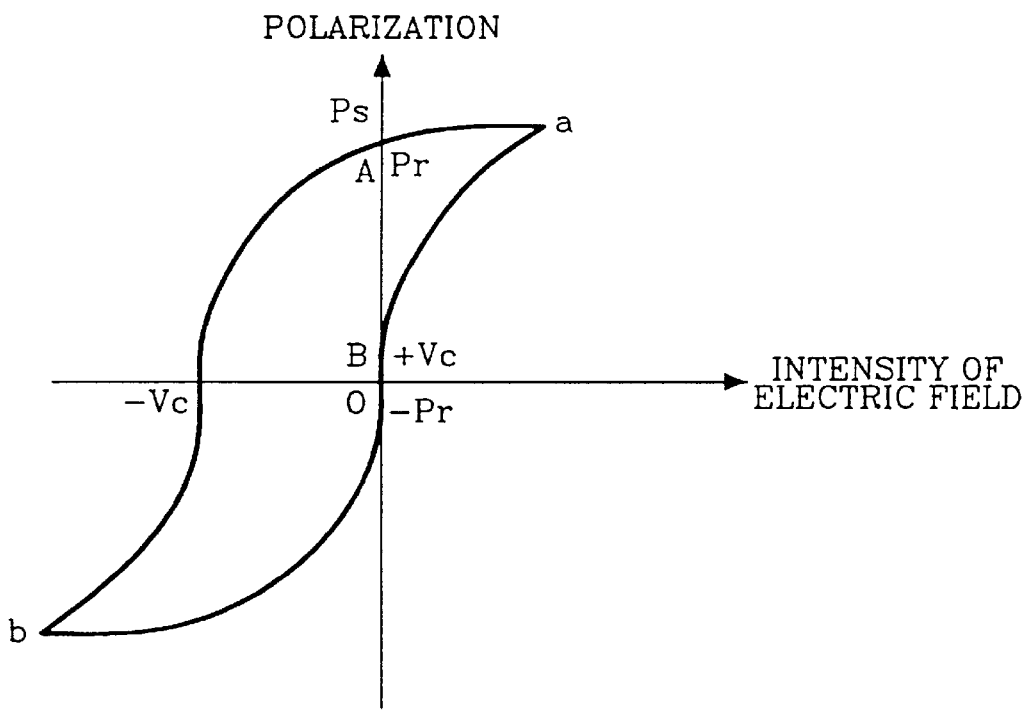
Figure 3:
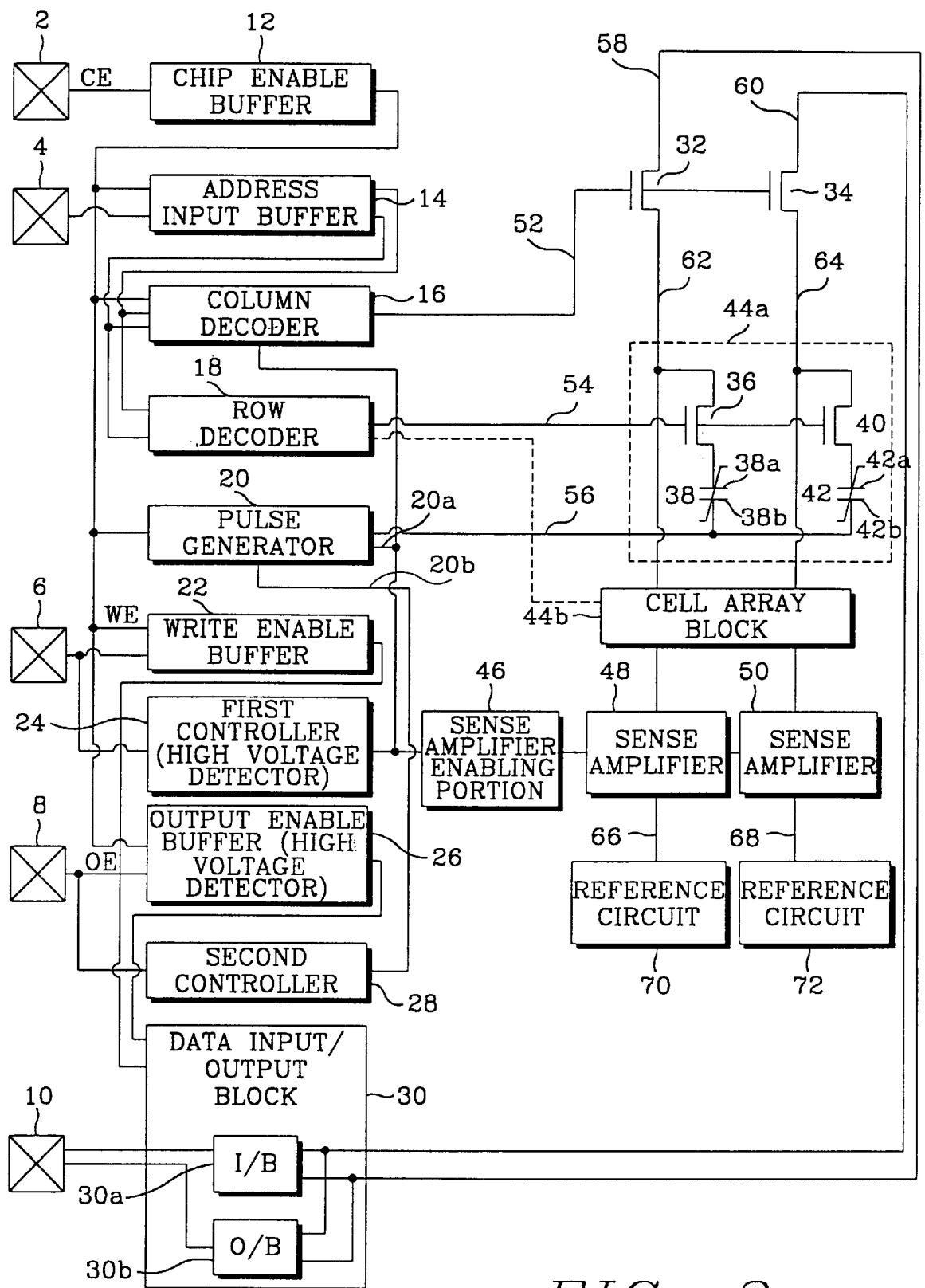
FIG. 3 is a block diagram of a ferroelectric semiconductor memory device having a circuit for compensating for the imprint of a ferroelectric capacitor according to one embodiment of the present invention.

FIG. 3 is a block diagram of a semiconductor memory device which includes a circuit for compensating imprinting degradations of ferroelectric capacitors according to the present invention. For convenience, FIG. 3 depicts two unit cells only connected to a single row or word line and circuit portions associated with the two unit cells. It should be noted that a multiplicity of unit cells can be arranged in a matrix form of rows and columns, with a row decoder for selecting one of row lines and a column decoder connected to a corresponding one of column selection gates for selecting at least one of column or bit lines.

Referring to FIG. 3, a preferred semiconductor memory device comprises a plurality of pads 2, 4, 6, 8 and 10. These pads include a chip enable pad 2 for applying a chip enable signal (CE) to a chip enable buffer 12, an address input pad 4 for applying an address signal to an address input buffer 14, a write enable pad 6 for applying a write enable signal (WE) to a write enable buffer 22 and for applying a high voltage higher than a chip internal supply voltage to a first control portion 24 at the time of a left imprint compensation mode of operation according to the feature of the present invention. An input enable pad 8 is used for applying an output enable signal (OE) to an output enable buffer 26 therethrough and for applying a high voltage higher than the supply voltage to a second control portion 28 at the time of a right imprint compensation mode of operation. An input/output pad 10 is provided for receiving external data and also for passing internal data to an external chip.

The preferred semiconductor memory device further includes multiple unit cells 44a or cell array blocks 44b, one or more of which are connected along the column or bit lines 62 and 64. Each unit cell comprises access transistors 36, 40 and one or more ferroelectric capacitors 38, 42. A cell array block 44b includes a plurality of unit cells such as unit cell 44a, in a matrix arrangement of multiple rows and columns. Each ferroelectric capacitor includes a storage electrode 38a and 42a and a plate electrode 38b and 42b. The storage electrodes 38a and 42a in the cell array block 44a are connected to sources of the access transistors 36 and 40 therein, respectively. The plate electrodes 38b and 42b are commonly connected to a plate line 56 which is connected to a pulse generator 20. Gates of the access transistors 36 and 40 are connected to a row or word line 54 which is connected to a row decoder 18. Drains of the access transistor 36 and 40 are connected to column or bit lines 62 and 64, respectively. Access transistors and ferroelectric capacitors of the cell array block 44b are connected in the same manner as those of the cell array block 44a.

The bit lines 62 and 64 then connect drains of the access transistors in cell array blocks to drains (or sources) of selection gates 32 and 34 respectively. Sources (or drains) of the selection transistors 32 and 34 are respectively connected to data lines 58 and 60 respectively. Gates of the selection transistor 32 and 34 are connected to a column decoder 16 for selecting bit lines in response to an output signal. Second ends opposite to the first ends of the bit lines 62 and 64 further connect to first sensing nodes of sense amplifiers 48 and 50 in an open bit line manner. Second sensing nodes of the sense amplifiers 48 and 50 are connected to reference lines 66 and 68, each of which is connected to a reference circuit 70 and 72 for providing a reference voltage to a corresponding sense amplifier during reading or writing mode of operation. Sensing operation of sense amplifiers with reference circuits is disclosed in U.S. Pat. No. 5,424,975 which is incorporated herein by reference.

A sense amplifier enabling portion 46 is connected to the sense amplifiers 48 and 50 and to the first controller 24. When a high voltage from the write enable pad 6 is detected by first controller 24, the sense amplifier enabling portion 46 disables the sense amplifiers 48 and 50 in order to compensate for a left imprint of the hysteresis loop. Similarly, the sense amplifier enabling portion 46 enables the sense amplifiers 48 and 50 in response to a high voltage detected by the first controller 24 in order to compensate a right imprint of the hysteresis loop. The sense amplifiers 48 and 50, when enabled, provide a full high state of voltage to the bit lines 62 and 64.

A pulse generating portion 20 has outputs 20a and 20b are connected to the first and second controllers 24 and 28, respectively. In a left imprint compensation mode, the pulse generator 20 sends left imprint compensation pulses to the plate electrodes 38b and 42b of the capacitors 38 and 42 via the plate line 56 in response to a control signal from the first control portion 24. Similarly, in a right imprint compensation mode, the pulse generator 20 sends a low level ground voltage to the plate electrodes 38a and 42a of the capacitors 38 and 42 via the line 56 in response to a control signal from the second controller 28.

A data input/output block 30 is connected to data lines 58 and 60, data input/output pad 10, and output of output enable buffer 26 and write enable buffer 22. The data input/output block 30 includes data input and output buffers, (30a and 30b) connected to the data input/output pad 10. During the left imprint compensation mode of operation, the data output buffer 30b in the data input/output block 30 provides high impedance. In contrast, during the right imprint compensation mode of operation, the data output buffer 30b passes the supply voltage Vcc, to data lines 58 and 60 in response to a high state signals applied to the pad 10. The address input buffer 14 is connected to the column and row decoders 16 and 18. The buffer 14 serves to latch addresses from the address input pad 4 and to forward the latched addresses to the row and column decoders 18 and 16. In the preferred embodiment, the latched addresses of address input buffer 14 are distributed to the row and column decoders 18 and 16 by means of a strobe-signal multiplexing. The chip enable buffer 12 engages various other buffers and circuit portions to cooperate within the device by activating a chip enable signal of the chip enable pad 2.

Figure 4:
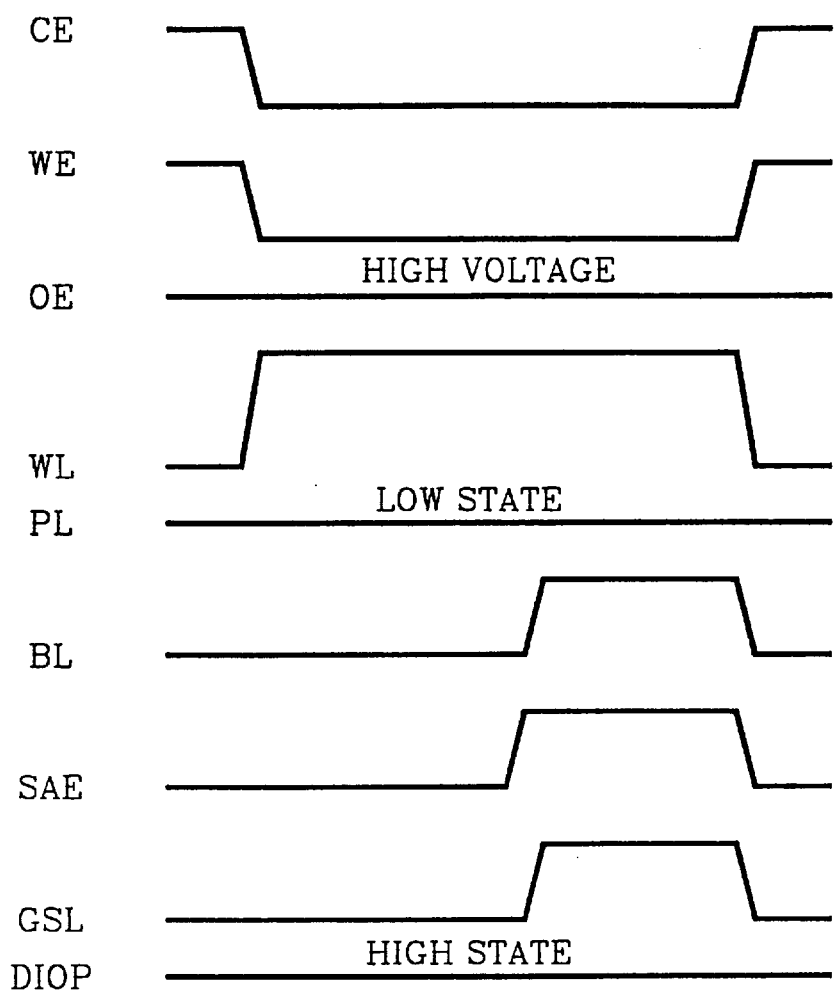
FIG. 4 is a timing diagram illustrating the principal signals of the circuit shown in FIG. 3 for compensating a right imprint in accordance with the methods of the present invention.
Figure 5:
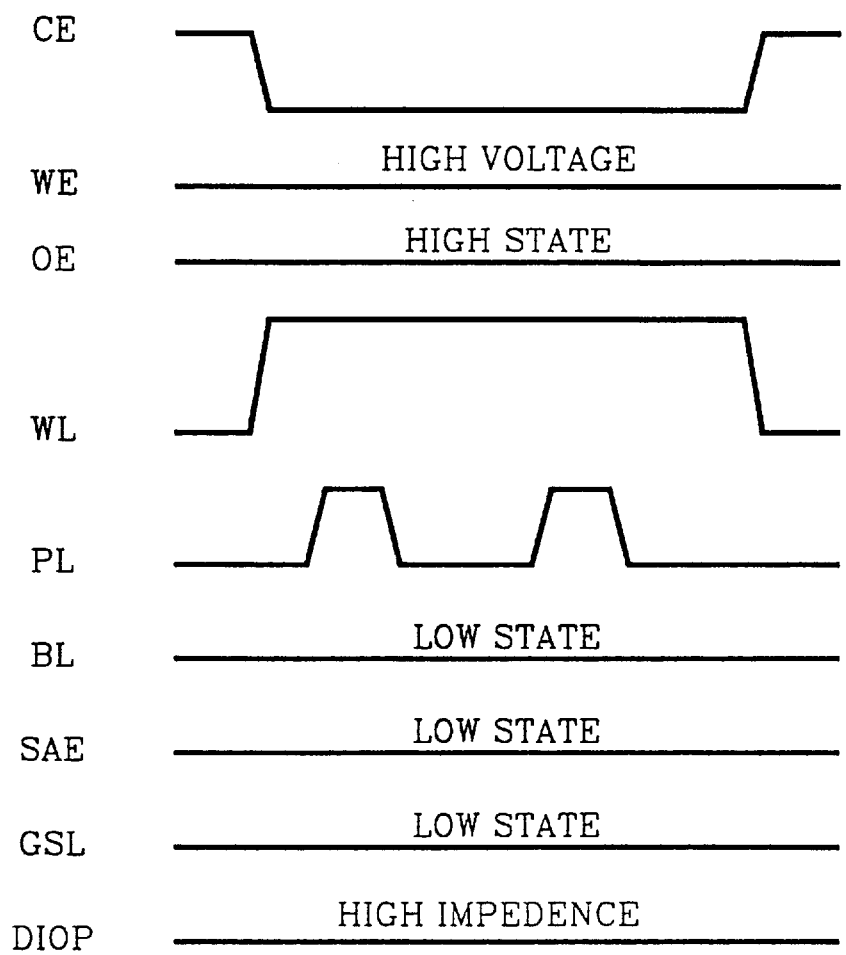
FIG. 5 is a timing diagram illustrating the principal signals of the circuit shown in FIG. 3 for compensating a left imprint in accordance with the methods of the present invention.

The operation of the preferred device in FIG.3 can be explained further by reference to FIGS. 4 and 5, each of which shows a timing diagram for the principal signals and parts illustrated in FIG. 3. FIGS. 4 and 5 are timing diagrams for right and left imprint compensations, respectively. Whether a given unit cell is in right or left imprint state can be determined by writing and reading of data to and from the cell after the completion of wafer process. For example, in the case where a unit cell is in the right imprint state, data "0" can be written into it and then its complement "1" cannot be written into it. In the case where a unit cell stays in the left imprint state, after data "1" has been written into the cell, its complement "0" cannot be written into it.

A right imprint compensation is commenced by activating of the chip enable signal CE, disabling the output enable signal OE, and by applying a high state (Vcc level) to the pad 10. At this time, a high voltage greater than the supply voltage Vcc (internal operation voltage) is applied to the write enable pad 6 as the output enable signal OE, as shown in FIGS. 3 and 4. In response to the chip enable signal CE going to a low state (a ground voltage), the chip enable buffer 12 causes the address input buffer 14, the column decoder 16 and the pulse generator 20 to activate. The address input buffer 14 receives addresses of cells requiring the restoration of a normal hysteresis loop. If it is determined that the ferroelectric capacitors 38 and 42 need to be compensated, the address input buffer 14 receives address signals designating the capacitors 38 and 42. The second control portion 28 outputs a control signal in response to the high voltage. The column decoder 16 outputs a high state on the gate selection line (GSL) 52 in response to the address signals. Therefore, the selection gates 32 and 34 are conductive or turned on. The high state voltage (Vcc) on the data bit lines 58 and 60, realized through the conductive selection gates 32 and 34, is applied through the bit lines 62 and 64 reduced to the threshold voltage of the selection gates 32 and 34. At this time, the sense amplifier enabling portion 46 causes the sense amplifiers 48 and 50 to be enabled. The sense amplifiers 48 and 50 amplify the threshold voltage to a full high state voltage. As a result, the selection gates 32 and 34 are turned off and the full high state voltage is written to the capacitors 38 and 42. The row decoder 18 outputs a high state or a boosted voltage greater than the high state, i.e. Vcc, in response to the address signals. Therefore, transistors 36 and 40 are conductive. On the other hand, the data input/output block 30 outputs high states on the data lines 58 and 60 in response to the output from the write enable buffer 22. The pulse generating portion 20 outputs a low states on the plate line 56. Therefore, storage nodes of ferroelectric capacitors 38 and 42 are pulsed by high states on the data lines 58 and 60. Although the storage nodes of ferroelectric capacitors 38 and 42 are pulsed once in a single cycle, it is obvious to those skilled in the art that a pulse signal can be supplied to the storage nodes by the application of the pulse signal to the data input/output pad 10.

Next, the operation of the left imprint compensation will be explained with reference to FIG. 3 and FIG. 5.

The operation of the left imprint compensation is executed by activating the chip enable signal CE, disabling the write WE and output enable signals OE, and the application of the high voltage to the write enable pad 6. Therefore, the write enable buffer 22 and the output enable buffer 26 are disabled and thereby the data output buffer 30b exerts a high impedance. The first control portion 24 outputs a control signal in response to the high voltage. The pulse generating portion 20 outputs a pulse signal on the plate line 56 in response to the control signal from the first control portion 24. The column decoder 16 outputs a low state on the gate selection line (GSL) 52 in response to the control signal. The row decoder 18 decodes row address signals and provides a boosted voltage greater than the internal operation voltage (Vcc) on the word line 54. The sense amplifier enabling portion 46 disables sense amplifiers 48 and 50 in response to the control signal. Therefore, the plate nodes of the ferroelectric capacitors 38 and 42 are pulsed by the pulse signal from the pulse generating portion 20 and thereby the capacitors 38 and 42 are restored to the normal hysteresis loop.

It will be understood that the particular device and circuit and the methods of operation embodying the invention are shown by way of illustration only and not as a limitation of the invention. The principles and features of this invention may be employed in varied and numerous embodiments without departing from the scope of the invention as set forth in the following claims.

What is claimed is:

1. A semiconductor memory device comprising:
   a unit memory cell including a ferroelectric capacitor having a first and second electrodes and an access transistor connected to the first electrode of the capacitor and to a bit line; and
   an imprint compensation circuit for applying a compensation signal to one of the first and second electrodes to make the ferroelectric capacitor imprinted in one of a first and second direction from a reference point have a normal polarization characteristic.

2. The semiconductor memory device as claimed in claim 1, wherein the imprint compensation circuit comprises:
   a predetermined voltage to the first electrode of the capacitor through the write path of the memory device;
   second means for applying a signal in the form of pulse to the second electrode where data access of the memory device is prohibited, to compensate for imprinting in the second direction.

3. The semiconductor memory device as claimed in claim 1, wherein the imprint compensation circuit comprises:
   a first controller for measuring the voltage applied to a write enable pad, controlling a column decoder, and providing a voltage level for writing applied to the bit line to the first electrode, for the purpose of compensation in the first direction when a predetermined level of reference voltage is applied to the second electrode; and
   a second controller for controlling a pulse generator by detecting a voltage applied to an output enable pad, which provides a voltage signal in the form of a pulse to the second electrode for the purpose of compensating in the second direction when a predetermined level of reference voltage is applied to the first electrode.

4. The semiconductor memory device as claimed in claim 3, wherein the first and second controllers are connected to an external pad, and sense a voltage applied to the pad, to thereby provide an output.

5. The semiconductor memory device as claimed in claim 1, wherein, the first direction is a direction compensating for the polarization characteristic of the ferroelectric capacitor to the right, the second direction compensates for it to the left.

6. The semiconductor memory device as claimed in claim 1, wherein the pulse is a pulse in a direction where the polarization state of the ferroelectric capacitor is not changed.

7. A semiconductor memory device comprising:
   a ferroelectric capacitor with two electrodes;
   a transistor connected to one of the two electrodes for accessing a data signal stored by the ferroelectric capacitor, the capacitor being susceptible to an imprint phenomenon in one of a first and second direction in the capacitor;
   an imprint compensation circuit for providing a predetermined pulse to one of the two electrodes while maintaining the other electrode at a predetermined voltage level, in response to a predetermined internal or external voltage.

8. A method for imprint compensation in the operation of a ferroelectric memory device which includes one or more unit cells, each including a ferroelectric capacitor having first and second electrodes and a transistor connected to the first electrode to access a data signal stored in the capacitor, the method comprising:
   determining whether a given unit cell is in a right or left imprint state;
   if the unit cell is in a right imprint state, applying a predetermined voltage to the first electrode through a write path of the memory device; and
   if the unit cell is in a left imprint state, applying a signal in the form of a pulse to the second electrode while blocking read-access to the memory device.

9. A method according to claim 7 in which the step of determining whether a given unit cell is in a right or left imprint state includes:
   writing a binary data signal into the capacitor using a write signal of a first polarity and a first magnitude;
   attempting to write a complementary binary data signal into the capacitor using a write signal of a a second magnitude approximating the first magnitude but a second polarity opposite the first polarity; and
   reading a data state of the capacitor to determine whether the stored data signal is the first-written binary data signal or the second-written complementary binary data signal.

* * * * *